(12) United States Patent
St. Rock et al.

(10) Patent No.: US 8,295,046 B2
(45) Date of Patent: Oct. 23, 2012

(54) NON-CIRCULAR RADIAL HEAT SINK

(75) Inventors: Brian St. Rock, Andover, CT (US);
Scott F. Kaslusky, West Hartford, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 12/838,536

(22) Filed: Jul. 19, 2010

(65) Prior Publication Data

US 2012/0014064 A1 Jan. 19, 2012

(51) Int. Cl.
*H05K 7/20* (2006.01)

(52) U.S. Cl. ... 361/697; 361/695; 165/80.3; 165/104.33

(58) Field of Classification Search ........................ None
See application file for complete search history.

(56) References Cited

U.S. PATENT DOCUMENTS

| | | | | |
|---|---|---|---|---|
| 4,733,293 A | * | 3/1988 | Gabuzda | 257/697 |
| 5,597,034 A | * | 1/1997 | Barker et al. | 165/80.3 |
| 5,661,638 A | * | 8/1997 | Mira | 361/697 |
| 6,015,008 A | * | 1/2000 | Kogure et al. | 165/185 |
| 6,167,952 B1 | | 1/2001 | Downing | |
| 6,213,195 B1 | | 4/2001 | Downing et al. | |
| 6,244,331 B1 | | 6/2001 | Budelman | |
| 6,278,353 B1 | | 8/2001 | Downing et al. | |
| 6,367,542 B1 | * | 4/2002 | Chen | 165/80.3 |
| 6,404,634 B1 | * | 6/2002 | Mann | 361/704 |
| 6,419,007 B1 | * | 7/2002 | Ogawara et al. | 165/80.3 |
| 6,479,895 B1 | | 11/2002 | Lee et al. | |
| 6,505,680 B1 | | 1/2003 | Hegde | |
| 6,525,939 B2 | | 2/2003 | Liang et al. | |
| 6,535,385 B2 | | 3/2003 | Lee | |
| 6,543,522 B1 | | 4/2003 | Hegde | |
| 6,587,341 B1 | | 7/2003 | Wei | |
| 6,633,484 B1 | | 10/2003 | Lee et al. | |
| 6,657,862 B2 | * | 12/2003 | Crocker et al. | 361/697 |
| 6,659,169 B1 | * | 12/2003 | Lopatinsky et al. | 165/121 |
| 6,664,673 B2 | | 12/2003 | Lopatinsky et al. | |
| 6,671,172 B2 | * | 12/2003 | Carter et al. | 361/697 |
| 6,714,415 B1 | * | 3/2004 | Shah | 361/704 |
| 6,755,242 B2 | | 6/2004 | White | |
| 6,937,473 B2 | * | 8/2005 | Cheng et al. | 361/704 |
| 7,120,020 B2 | | 10/2006 | Carter et al. | |
| 7,164,584 B2 | | 1/2007 | Walz | |
| 7,188,418 B2 | | 3/2007 | Shah | |
| 7,193,849 B2 | | 3/2007 | Xu et al. | |

(Continued)

FOREIGN PATENT DOCUMENTS

GB 2377321 A 8/2003

(Continued)

*Primary Examiner* — Boris Chervinsky
(74) *Attorney, Agent, or Firm* — Cantor Colburn LLP

(57) ABSTRACT

A heat sink includes a blower located in the heat sink and a plurality of fins extending from a periphery of the blower toward a perimeter of the heat sink. The plurality of fins define a plurality of channels each having a channel inlet located at the blower and a channel exit located at the perimeter of the heat sink. The plurality of channels vary in length around the perimeter of the heat sink A velocity of an air flow from the blower at each channel inlet is substantially equal for each channel of the plurality of channels, and a total pressure drop from the channel inlet to the channel exit is substantially equal for each channel of the plurality of channels.

17 Claims, 3 Drawing Sheets

U.S. PATENT DOCUMENTS

| | | |
|---|---|---|
| 7,200,934 B2 | 4/2007 | Carter et al. |
| 7,361,081 B2 | 4/2008 | Beitelmal et al. |
| 7,760,506 B1 | 7/2010 | Wang et al. |
| 7,775,062 B2 | 8/2010 | Blomquist |
| 7,796,389 B2 | 9/2010 | Edmunds et al. |
| 7,814,967 B2 | 10/2010 | Harman |
| 7,880,283 B2 | 2/2011 | Zhuang |
| 7,911,790 B2 | 3/2011 | Carter et al. |
| 2002/0171139 A1 | 11/2002 | Lee et al. |
| 2003/0046967 A1 | 3/2003 | Pollard, II et al. |
| 2006/0042777 A1 | 3/2006 | Delano et al. |
| 2006/0187642 A1 | 8/2006 | Jeong |
| 2007/0119205 A1 | 5/2007 | Zywiak et al. |
| 2010/0170657 A1 | 7/2010 | Kaslusky |

FOREIGN PATENT DOCUMENTS

| | | |
|---|---|---|
| WO | WO02093643 A1 | 11/2002 |

* cited by examiner

NON-CIRCULAR RADIAL HEAT SINK

FEDERAL RESEARCH STATEMENT

This invention was made with Government support under United States Government contract W31P4Q-09-C-0067 awarded by the U.S. Army. The Government has certain rights in the invention.

BACKGROUND OF THE INVENTION

The subject matter disclosed herein relates to cooling of electronic components. More specifically, the subject disclosure relates to heat sink configurations for packaged electronics.

To facilitate packaging, electronics devices are typically contained within rectangular enclosures. The electronics devices contained in the rectangular enclosures may be air-cooled or liquid-cooled depending on the application. These rectangular enclosures are typically cooled using externally-located fans and linear heat sinks that are readily compatible with the rectangular enclosures. Power conversion electronics in particular are typically packaged on a rectangular cold-plate, with a high-density fin structure placed below heat dissipating components to transfer thermal energy away from the components. In typical air-cooled systems, a fan, which is separate from and external to the heat sink structure, is used to provide motive force to drive airflow through the fin structure of the heat sink to carry thermal energy away from the heat sink and the electronics components. In general, as the blades of a blower/fan rotate, they perform work on the airflow, thereby generating a total gauge pressure consisting of a static pressure and dynamic pressure component. A portion of the dynamic pressure is converted to static pressure as the airflow leaves the rotating blades and passes through a diffuser. The increased static pressure at the exit of the blower and diffuser drives flow into the channels of the heat sink, between the fins. Flow passes through the channels from the high pressure at the channel inlet to a low pressure at the channel exit. The pressure drop in each channel is typically the same, since the length and width of each channel and the mass flow in each channel is typically the same since the driving static pressure gradient is the same for all channels. The gauge pressure downstream from the exit of the channels is taken to be the reference pressure (zero).

BRIEF DESCRIPTION OF THE INVENTION

According to one aspect of the invention, a heat sink includes a blower located in the heat sink and a plurality of fins extending from a periphery of the blower toward a perimeter of the heat sink. The plurality of fins define a plurality of channels each having a channel inlet located at the blower and a channel exit located at the perimeter of the heat sink. The plurality of channels vary in length around the perimeter of the heat sink. A velocity of an air flow from the blower at each channel inlet is substantially equal for each channel of the plurality of channels, and a total pressure drop from the channel inlet to the channel exit is substantially equal for each channel of the plurality of channels.

According to another aspect of the invention, an electronics package includes an enclosure and one or more electronics components located in the enclosure. A heat sink is positioned in proximity to the one or more electronics components to cool the one or more electronics components. The heat sink includes a blower disposed in the heat sink and a plurality of fins extending from a periphery of the blower toward a perimeter of the heat sink. The plurality of fins define a plurality of channels each having a channel inlet located at the blower and a channel exit located at the perimeter of the heat sink. The plurality of channels vary in length around the perimeter of the heat sink. A velocity of an air flow from the blower at each channel inlet is substantially equal for each channel of the plurality of channels, and a total pressure drop from the channel inlet to the channel exit is substantially equal for each channel of the plurality of channels.

According to yet another aspect of the invention, a method of dissipating thermal energy from an electronics component includes locating a heat sink proximate to the electronics component. The heat sink includes a blower disposed in the heat sink and a plurality of fins extending from a periphery of the blower toward a perimeter of the heat sink. The plurality of fins defining a plurality of channels each having a channel inlet disposed at the blower and a channel exit disposed at the perimeter of the heat sink. The plurality of channels vary in length around the perimeter of the heat sink. Thermal energy is transferred from the electronics component to the plurality of fins. An airflow is urged from the blower into the plurality of channels at the channel inlets and is flowed past the plurality of fins, thereby transferring thermal energy from the plurality of fins to the airflow. The airflow is flowed to a plurality of channel exits thereby dissipating the thermal energy. A velocity of the air flow at the channel inlet is substantially equal for each channel of the plurality of channels, and a total pressure drop from the channel inlet to channel exit is substantially equal for each channel of the plurality of channels.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
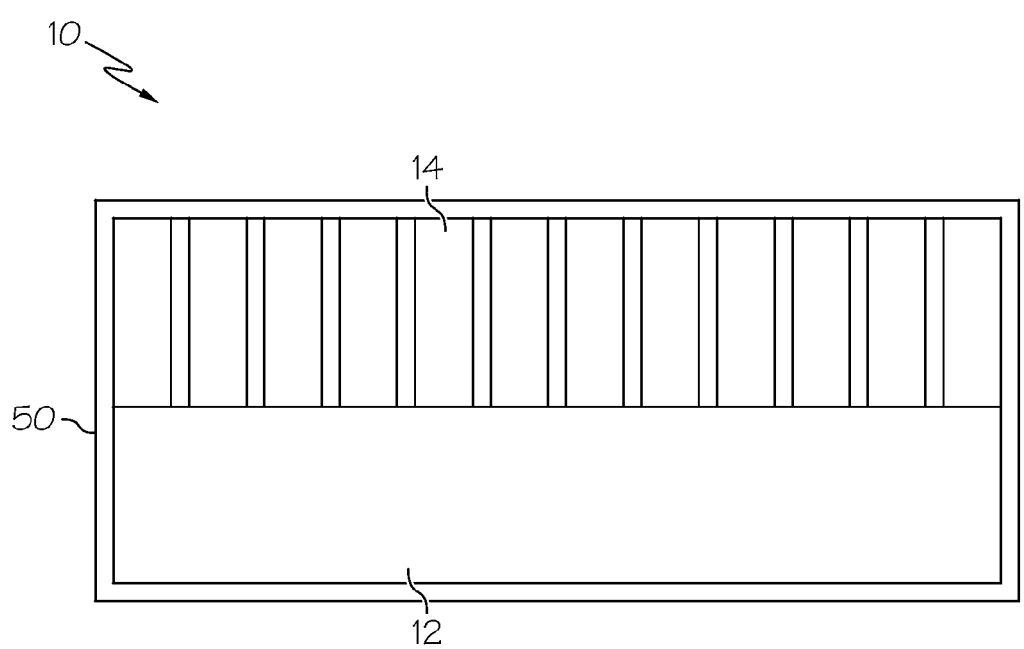
FIG. 1 is schematic view of an embodiment of an electronics package.

Shown in FIG. 1 is a schematic view of an electronics package 10 including an enclosure 50 containing one or more heat-producing electronics components 12, for example, a power converter or the like. A heat sink 14 is located proximate to the component 12, and in some embodiments, adjacent to, or in contact with the component 12.

Figure 2:
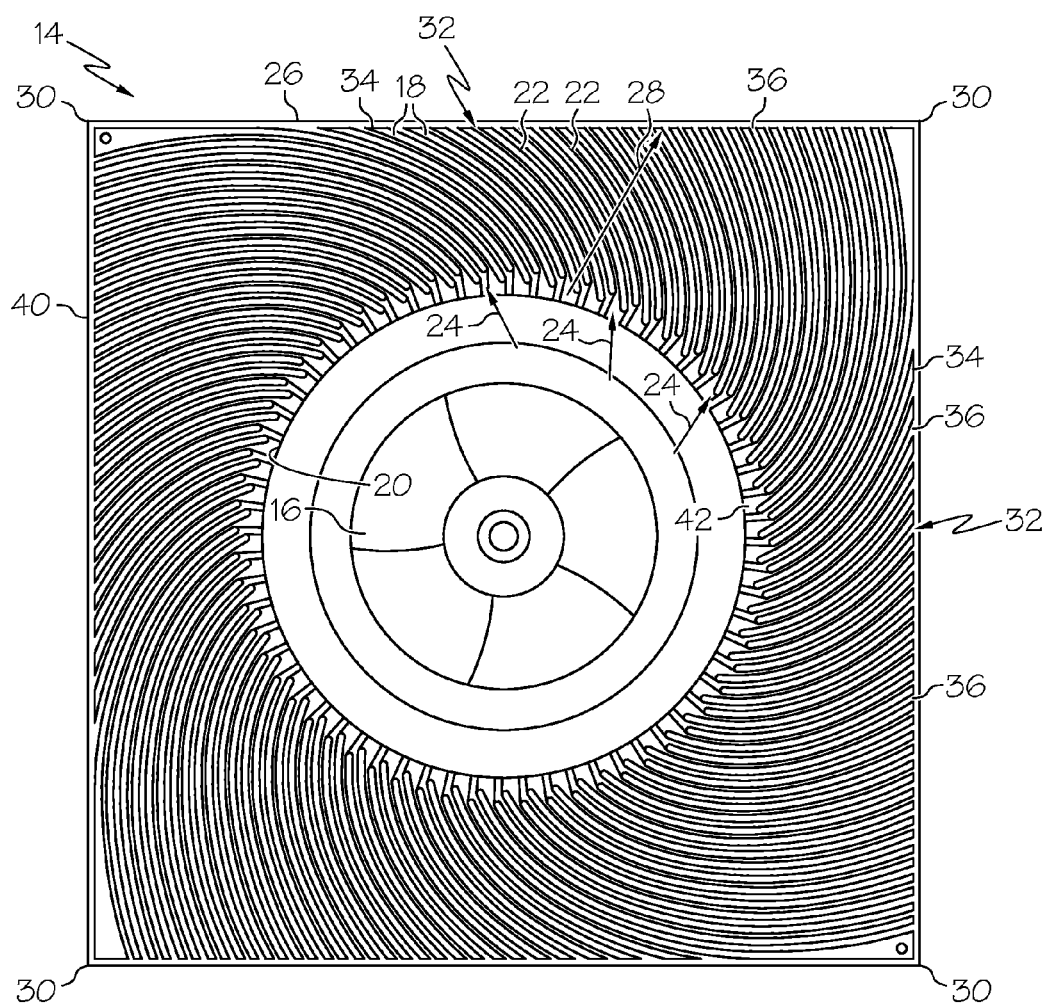
FIG. 2 is a plan view of an embodiment of a heat sink.

Referring now to FIG. 2, the heat sink 14 is configured as a radial heat sink 14. The heat sink 14 includes a fan or blower 16, which, in some embodiments, is substantially integral to the heat sink 14, and in some embodiments, is a centrifugal blower located substantially at a center of the heat sink 14. A plurality of fins 18 are arranged on a heat sink plate 40 and extend outwardly from a periphery 20 of the blower 16 toward a perimeter 26 of the heat sink 14 defining a plurality of heat sink channels 22 between adjacent fins 18 of the plurality of fins. In operation, thermal energy is transferred from the component 12 to the heat sink 14 and into the plurality of fins 18. The blower 16, connected to a power source (not shown), is activated and a total head, including a dynamic head component and an associated flow velocity, is created and airflow 24 is urged from the blower 16 into the plurality of channels 22. The blower 16 provides airflow of a substantially equal in velocity to each channel 22 of the plurality of channels 22 at a channel inlet 42. As the airflow 24 flows through the plurality of channels 22 and past the fins 18, thermal energy is transferred to the airflow 24 and ejected when the airflow 24 reaches the perimeter 26 of the heat sink 14.

As can be seen in FIG. 2, a distance 28 from the periphery 20 of the blower 16 to the perimeter 26 of the heat sink 14 varies around the periphery 20 of the blower 16. Thus, a length of the plurality of channels 22 varies around the perimeter 26 of the heat sink 14. For example, the distance 28 is greater at a corner 30 of the heat sink 14 than at a midpoint 32 of a side 34 of the heat sink 14. When the airflow 24 flows through channels 22 of uniform configuration, such as width, but of differing lengths, a different pressure drop is seen at channel exits 36 of channels 22 having differing lengths. To increase efficiency of the heat sink 14 and to reduce losses, an average velocity of the air flow 24 at the channel entrances 42 is substantially equal for each channel 22 of the plurality of channels 22, and the total pressure drop from each channel inlet 42 to each channel exit 36 is also substantially equal for each channel 22 of the plurality of channels 22.

Figure 3:
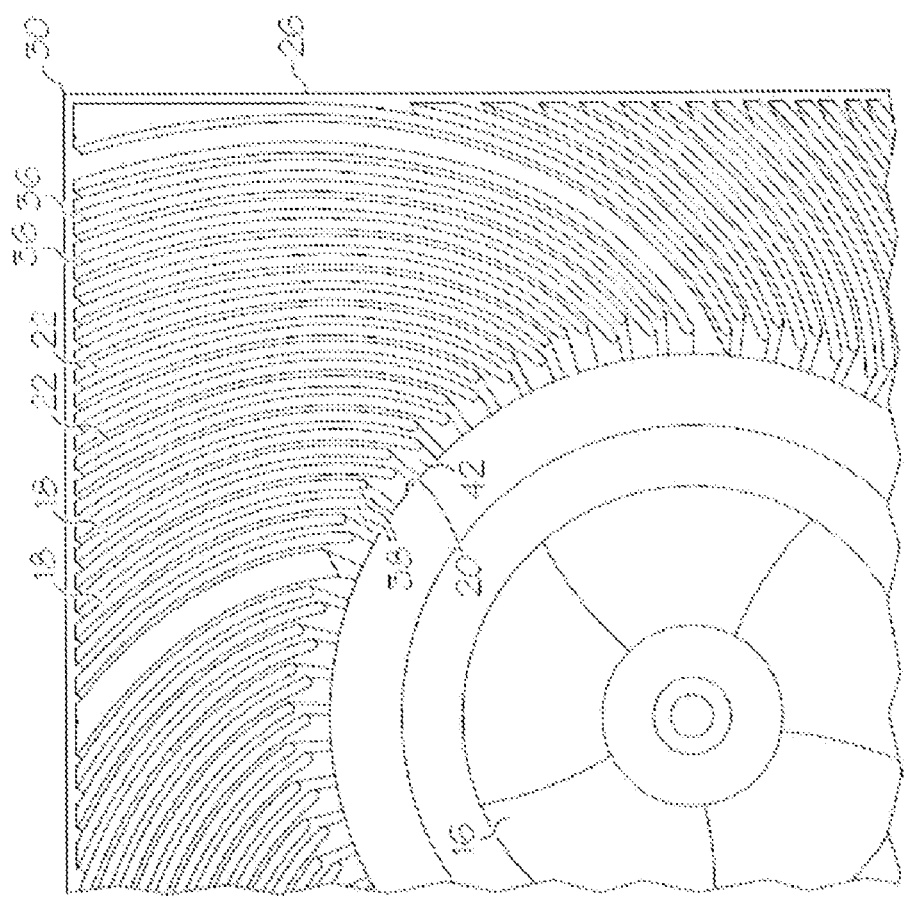
FIG. 3 is a plan view of another embodiment of a heat sink.

As shown in FIG. 3, total pressure drop matching is accomplished by introducing variations in the channel 22 geometry around the heat sink 14. For example, shorter channels 22 may be narrower, with adjacent fins 18 closer together, while longer channels 22 may be wider, with adjacent fins 18 further apart, thus equalizing the total pressure drop at each channel 22. Channel 22 width may also be varied to cool a non-uniform heat flux from components 12 in contact with the heat sink 14. A greater number of narrow channels 22 may be utilized to cool a relatively high heat flux component 12, while a lesser number of wider channels 22 may be utilized to cool a relatively low heat flux component 12. Further, longer channels 22 may also have a fin tip 38 retracted from the blower 16, relative to fin tips 38 of other channels 22, thus retracting the channel inlet 42 from the blower 16 relative to other channel inlets 42. While varying the channel 22 width and staggering the fin tip 38 position are illustrated as means to equalize the total pressure drop, any suitable means may be utilized to achieve the pressure drop equalization. For example, pins may be inserted into longer channels 22, or a thickness of fins 18 may be varied to achieve the total pressure drop equalization.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A heat sink comprising:
a blower disposed in the heat sink; and
a plurality of fins extending from a periphery of the blower toward a perimeter of the heat sink, the plurality of fins defining a plurality of channels each having a channel inlet disposed at the blower and a channel exit disposed at the perimeter of the heat sink, the plurality of channels varying in length around the perimeter of the heat sink;
wherein a velocity of an air flow from the blower at each channel inlet is substantially equal for each channel of the plurality of channels, and a total pressure drop from the channel inlet to the channel exit is substantially equal for each channel of the plurality of channels, a first channel of the plurality of channels having a first length has a first width along its length different than a second width of a second channel of the plurality of channels having a second length different from the first length, the first width and the second width constant along the first length and the second length.

2. The heat sink of claim 1, wherein the plurality of channels vary in width to cool a non-uniform heat flux.

3. The heat sink of claim 1, wherein the width of the plurality of channels is varied by varying a distance between adjacent fins.

4. The heat sink of claim 1, wherein the width of the plurality of channels is varied by varying a fin thickness of the plurality of fins.

5. The heat sink of claim 1, wherein a position of a channel inlet relative to the blower is varied to equalize the total pressure drop.

6. The heat sink of claim 1, wherein the blower is a centrifugal blower.

7. The heat sink of claim 1, wherein the plurality of channels are arranged on a non-circular plan-form.

8. An electronics package comprising:
an enclosure;
one or more electronics components disposed in the enclosure; and
a heat sink disposed in proximity to the one or more electronics components to cool the one or more electronics components, the heat sink including:
a blower disposed in the heat sink; and
a plurality of fins extending from a periphery of the blower toward a perimeter of the heat sink, the plurality of fins defining a plurality of channels each having a channel inlet disposed at the blower and a channel exit disposed at the perimeter of the heat sink, the plurality of channels varying in length around the perimeter of the heat sink;
wherein a velocity of an air flow from the blower at each channel inlet is substantially equal for each channel of the plurality of channels, and a total pressure drop from the channel inlet to the channel exit is substantially equal for each channel of the plurality of channels, a first channel of the plurality of channels having a first length has a first width along its length different than a second width of a second channel of the plurality of channels having a second length different from the first length, the first width and the second width constant along the first length and the second length.

9. The electronics package of claim 8, wherein the plurality of channels vary in width to cool a non-uniform heat flux.

10. The electronics package of claim 8, wherein the width of the plurality of channels is varied by varying a distance between adjacent fins.

11. The electronics package of claim 8, wherein the width of the plurality of channels is varied by varying a fin thickness of the plurality of fins.

12. The electronics package of claim 8, wherein a position of a channel inlet relative to the blower is varied to equalize the total pressure drop.

13. The electronics package of claim 8, wherein the one or more electronics components includes a power converter.

14. The electronics package of claim 8, wherein the heat sink is in contact with the one or more electronics components.

15. The electronics package of claim 8, wherein the blower is a centrifugal blower.

16. The electronics package of claim 8, wherein the plurality of channels are arranged on a non-circular plan-form.

17. A method of dissipating thermal energy from an electronics component comprising:

locating a heat sink proximate to the electronics component, the heat sink including:
  a blower disposed in the heat sink; and
  a plurality of fins extending from a periphery of the blower toward a perimeter of the heat sink, the plurality of fins defining a plurality of channels each having a channel inlet disposed at the blower and a channel exit disposed at the perimeter of the heat sink, the plurality of channels varying in length around the perimeter of the heat sink;
  transferring thermal energy from the electronics component to the plurality of fins;
  urging an airflow from the blower into the plurality of channels at the channel inlets;
  flowing the airflow past the plurality of fins, thereby transferring thermal energy from the plurality of fins to the airflow; and
  flowing the airflow to a plurality of channel exits thereby dissipating the thermal energy;
  wherein a velocity of the air flow at the channel inlet is substantially equal for each channel of the plurality of channels, and a total pressure drop from the channel inlet to channel exit is substantially equal for each channel of the plurality of channels, a first channel of the plurality of channels having a first length has a first width along its length different than a second width of a second channel of the plurality of channels having a second length different from the first length, the first width and the second width constant along the first length and the second length.

* * * * *